United States Patent
Khial et al.

(10) Patent No.: US 10,727,586 B2
(45) Date of Patent: Jul. 28, 2020

(54) NON-RECIPROCAL TRANSCEIVER ARRAY ARCHITECTURE WITH A SINGLE NON-RECIPROCAL ELEMENT

(71) Applicant: California Institute of Technology, Pasadena, CA (US)

(72) Inventors: Parham Porsandeh Khial, Pasadena, CA (US); Seyed Mohammadreza Fatemi, La Canada, CA (US); Alexander D. White, Carlsbad, CA (US); Seyed Ali Hajimiri, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 16/514,894

(22) Filed: Jul. 17, 2019

(65) Prior Publication Data
US 2020/0099131 A1    Mar. 26, 2020

Related U.S. Application Data

(60) Provisional application No. 62/699,208, filed on Jul. 17, 2018.

(51) Int. Cl.
*H01Q 3/34* (2006.01)
*H04B 1/40* (2015.01)
*H01P 1/397* (2006.01)

(52) U.S. Cl.
CPC .............. *H01Q 3/34* (2013.01); *H01P 1/397* (2013.01); *H04B 1/40* (2013.01)

(58) Field of Classification Search
CPC .............. H01Q 3/34; H01P 1/397; H04B 1/40

USPC ...................................................... 455/78–81
See application file for complete search history.

(56) References Cited

U.S. PATENT DOCUMENTS

| | | | |
|---|---|---|---|
| 2,540,414 A * | 2/1951 | Aicardi ................ | G01S 1/02 342/407 |
| 4,101,902 A * | 7/1978 | Trigon .................. | H01Q 3/34 342/129 |
| 4,232,399 A | 11/1980 | Heiter | |
| 2004/0100315 A1 | 5/2004 | Hyoung et al. | |

(Continued)

OTHER PUBLICATIONS

Yu et al., "A 60 GHz Phase Shifter Integrated With LNA and PA in 65 nm CMOS for Phased Array Systems," IEEE Journal of Solid-State Circuits, 45(9):1697-1709, (2010).

(Continued)

*Primary Examiner* — Lee Nguyen
(74) *Attorney, Agent, or Firm* — Alston & Bird LLP

(57) ABSTRACT

A communicate device includes transmitters and a receiver. The first transmitter is coupled to a first 90° phase shifter that is also coupled to a first antenna, and to a second 90° phase shifter that is also coupled to a first node. The second transmitter is coupled to a third 90° phase shifter that is also coupled to a second antenna, and to a fourth 90° phase shifter that is also coupled to the first node. The receiver is coupled to a fifth 90° phase shifter that is also coupled to the first antenna, and to a sixth 90° phase shifter that is also coupled to the second antenna. A non-reciprocal element, coupled between the receiver and the first node, provides a 90° phase shift from the receiver to the first node and a −90° phase shift from the first node to the receiver.

28 Claims, 9 Drawing Sheets

(56) References Cited

U.S. PATENT DOCUMENTS

| | | |
|---|---|---|
| 2005/0129157 A1 | 6/2005 | Ashida |
| 2014/0192845 A1* | 7/2014 | Szini .................... H04B 7/0413 |
| | | 375/219 |
| 2016/0087823 A1 | 3/2016 | Wang |
| 2017/0195003 A1 | 7/2017 | Rosson et al. |

OTHER PUBLICATIONS

WIPO Application No. PCT/US2019/042281, PCT International Search Report and Written Opinion of the International Searching Authority dated Oct. 2, 2019.

* cited by examiner

NON-RECIPROCAL TRANSCEIVER ARRAY ARCHITECTURE WITH A SINGLE NON-RECIPROCAL ELEMENT

CROSS REFERENCE TO RELATED APPLICATIONS

The present application claims benefit under 35 USC 119(e) of U.S. Application Ser. No. 62/699,208, filed Jul. 17, 2018, the content of which is incorporated herein by reference in its entirety.

FIELD OF THE INVENTION

The present invention relates to a communication system, and more particularly to a scalable phased array that includes isolated transmitter and receiver units.

BACKGROUND

Phased arrays are used in communications, arbitrary field manipulation, ranging, and sensing applications like radar. A phased array system capable of beamforming using only electronic components—and without any mechanical parts—has an enhanced flexibility and robustness, a relatively higher resolution scan, faster scanning rate, and an improved overall performance.

A phased array includes an array of antenna elements each with an independent phase controller. By tuning these phases, an array can utilize the coherent addition and subtraction of propagating waves to shape the reception or transmission pattern. A phased array transmitter often drives its antennas with the same signal and different phases to generate a steerable propagating beam. A phased array receiver adds the signals it receives from its elements in order to increase sensitivity to a certain direction while attenuating signals received from other directions. Such beamforming allows for wireless transmission and reception along a given direction without the need to physically move a large antenna.

Systems such as radars and telecommunication equipment need to rapidly transmit and receive data. Such systems may use two antennas, one for transmission and one for reception. Alternatively, such systems can use one antenna to receive and transmit data but at different times. Systems that use one antenna for signal transmission and another antenna for signal reception occupy twice the amount of space or have half the bandwidth of system using a single antenna. Therefore, it is highly desirable to have a full duplex system capable of transmitting and receiving data continuously with the same antenna. Such a system would require a high degree of isolation between its transmitter and receiver units.

In order to achieve full transmission from the transmitter to antenna and antenna to receiver, conventional systems require multiple components such as magnetic elements, active circuits, or time-varying circuits. Such elements are relatively large and expensive. A need continues to exist for a full duplex phased array that used a single non-reciprocal element to drive its antennas.

SUMMARY OF THE INVENTION

A communicate device, in accordance with one embodiment of the present invention, includes in part, a first transmitter coupled to a first terminal of a first 90° phase shifter having a second terminal coupled to a first antenna, and to a first terminal of a second 90° phase shifter having a second terminal coupled to a first node; a second transmitter coupled to a first terminal of a third 90° phase shifter having a second terminal coupled to a second antenna, and to a first terminal of a fourth 90° phase shifter having a second terminal coupled to the first node; a receiver coupled to a first terminal of a fifth 90° phase shifter having a second terminal coupled to the first antenna, and to a first terminal of a sixth 90° phase shifter having a second terminal coupled to the second antenna; and a non-reciprocal element coupled between the receiver and the first node. The non-reciprocal element provides a 90° phase shift from the receiver to the first node and a −90° phase shift from the first node to the receiver.

In one embodiment, the communicate device further includes, in part, a third transmitter coupled to a first terminal of a seventh 90° phase shifter having a second terminal coupled to a third antenna, and to a first terminal of an eighth 90° phase shifter having a second terminal coupled to the first node. The third antenna is coupled to the receiver via a ninth 90° phase shifter.

In one embodiment, the communicate device further includes, in part, a fourth transmitter coupled to a first terminal of a tenth 90° phase shifter having a second terminal coupled to a fourth antenna, and to a first terminal of an eleventh 90° phase shifter having a second terminal coupled to the first node. The fourth antenna coupled to the receiver via a twelfth 90° phase shifter.

In one embodiment, the communication device further includes, in part, a first phase shifter adapted to shift a phase of a signal generated by the first transmitter, and a second phase shifter adapted to shift a phase of a signal generated by the second transmitter.

In one embodiment, the communication device further includes, in part, a first phase shifter adapted to shift a phase of a signal generated by the first transmitter, a second phase shifter adapted to shift a phase of a signal generated by the second transmitter, and a third phase shifter adapted to shift a phase of a signal generated by the third transmitter.

In one embodiment, the communication device further includes, in part, a third phase shifter adapted to shift a phase of a signal received by the first antenna; and a fourth phase shifter adapted to shift a phase of a signal received by the second antenna. In one embodiment, the communication device further includes, in part, a fourth phase shifter adapted to shift a phase of a signal received by the first antenna, a fifth phase shifter adapted to shift a phase of a signal received by the second antenna, and a sixth phase shifter adapted to shift a phase of a signal received by the third antenna.

A communicate device, in accordance with one embodiment of the present invention, includes, in part, a first receiver coupled to a first terminal of a first 90° phase shifter having a second terminal coupled to a first antenna, and to a first terminal of a second 90° phase shifter having a second terminal coupled to a first node; a second receiver coupled to a first terminal of a third 90° phase shifter having a second terminal coupled to a second antenna, and to a first terminal of a fourth 90° phase shifter having a second terminal coupled to the first node; a transmitter coupled to a first terminal of a fifth 90° phase shifter having a second terminal coupled to the first antenna, and to a first terminal of a sixth 90° phase shifter having a second terminal coupled to the second antenna; and a non-reciprocal element coupled between the transmitter and the first node. The non-reciprocal element provides a −90° phase shift from the transmitter to the first node and a 90° phase shift from the first node to the transmitter.

In one embodiment, the communicate device further includes, in part, a third receiver coupled to a first terminal of a seventh 90° phase shifter having a second terminal coupled to a third antenna, and to a first terminal of an eighth 90° phase shifter having a second terminal coupled to the first node. The third antenna is coupled to the third receiver via a ninth 90° phase shifter.

In one embodiment, the communicate device further includes, in part, a fourth receiver coupled to a first terminal of a tenth 90° phase shifter having a second terminal coupled to a fourth antenna, and to a first terminal of an eleventh 90° phase shifter having a second terminal coupled to the first node. The fourth antenna is coupled to the fourth receiver via a twelfth 90° phase shifter.

In one embodiment, the communicate device further includes, in part, a first phase shifter adapted to shift a phase of a signal received by the first receiver, and a second phase shifter adapted to shift a phase of a signal received by the second receiver.

In one embodiment, the communicate device further includes, in part, a first phase shifter adapted to shift a phase of a signal received by the first receiver, a second phase shifter adapted to shift a phase of a signal received by the second receiver, and a third phase shifter adapted to shift a phase of a signal received by the third receiver.

In one embodiment, the communicate device further includes, in part, a third phase shifter adapted to shift a phase of a signal delivered for transmission by the first antenna, and a fourth phase shifter adapted to shift a phase of a signal delivered for transmission by the second antenna.

In one embodiment, the communicate device further includes, in part, a fourth phase shifter adapted to shift a phase of a signal delivered for transmission by the first antenna, a fifth phase shifter adapted to shift a phase of a signal delivered for transmission by the second antenna, and a sixth phase shifter adapted to shift a phase of a signal delivered for transmission by the third antenna.

A method of communication, in accordance with one embodiment of the present invention, includes, in part, coupling a first transmitter to a first terminal of a first 90° phase shifter having a second terminal coupled to a first antenna, and to a first terminal of a second 90° phase shifter having a second terminal coupled to a first node. The method further includes, in part, coupling a second transmitter to a first terminal of a third 90° phase shifter having a second terminal coupled to a second antenna, and to a first terminal of a fourth 90° phase shifter having a second terminal coupled to the first node. The method further includes, in part, coupling a receiver to a first terminal of a fifth 90° phase shifter having a second terminal coupled to the first antenna, and to a first terminal of a sixth 90° phase shifter having a second terminal coupled to the second antenna. The method further includes, in part, coupling a non-reciprocal element between the receiver and the first node. The non-reciprocal element provides a 90° phase shift from the receiver to the first node and a −90° phase shift from the first node to the receiver In one embodiment, the method further includes, in part, coupling a third transmitter to a first terminal of a seventh 90° phase shifter having a second terminal coupled to a third antenna, and to a first terminal of an eighth 90° phase shifter having a second terminal coupled to the first node. The third antenna is coupled to the receiver via a ninth 90° phase shifter.

In one embodiment, the method further includes, in part, coupling a fourth transmitter to a first terminal of a tenth 90° phase shifter having a second terminal coupled to a fourth antenna, and to a first terminal of an eleventh 90° phase shifter having a second terminal coupled to the first node. The fourth antenna is coupled to the receiver via a twelfth 90° phase shifter In one embodiment, the method further includes, in part, shifting a phase of a signal generated by the first transmitter, and shifting a phase of a signal generated by the second transmitter. In one embodiment, the method further includes, in part, shifting a phase of a signal generated by the first transmitter, shifting a phase of a signal generated by the second transmitter, and shifting a phase of a signal generated by the third transmitter.

In one embodiment, the method further includes, in part, shifting a phase of a signal received by the first antenna, and shifting a phase of a signal received by the second antenna. In one embodiment, the method further includes, in part, shifting a phase of a signal received by the first antenna, shifting a phase of a signal received by the second antenna, and shifting a phase of a signal received by the third antenna.

A method of communication, in accordance with one embodiment of the present invention, includes, in part, coupling a first receiver to a first terminal of a first 90° phase shifter having a second terminal coupled to a first antenna, and to a first terminal of a second 90° phase shifter having a second terminal coupled to a first node. The method further includes, in part, coupling a second receiver to a first terminal of a third 90° phase shifter having a second terminal coupled to a second antenna, and to a first terminal of a fourth 90° phase shifter having a second terminal coupled to the first node. The method further includes, in part, coupling a transmitter to a first terminal of a fifth 90° phase shifter having a second terminal coupled to the first antenna, and to a first terminal of a sixth 90° phase shifter having a second terminal coupled to the second antenna. The method further includes, in part, coupling a non-reciprocal element between the transmitter and the first node. The non-reciprocal element provides a −90° phase shift from the transmitter to the first node and a 90° phase shift from the first node to the transmitter In one embodiment, the method further includes, in part, coupling a third receiver to a first terminal of a seventh 90° phase shifter having a second terminal coupled to a third antenna, and to a first terminal of an eighth 90° phase shifter having a second terminal coupled to the first node. The third antenna is coupled to the third receiver via a ninth 90° phase shifter.

In one embodiment, the method further includes, in part, coupling a fourth receiver to a first terminal of a tenth 90° phase shifter having a second terminal coupled to a fourth antenna, and to a first terminal of an eleventh 90° phase shifter having a second terminal coupled to the first node. The fourth antenna is coupled to the fourth receiver via a twelfth 90° phase shifter In one embodiment, the method further includes, in part, shifting a phase of a signal received by the first receiver, and shifting a phase of a signal received by the second receiver. In one embodiment, the method further includes, in part, shifting a phase of a signal received by the first receiver, shifting a phase of a signal received by the second receiver, and shifting a phase of a signal received by the third receiver.

In one embodiment, the method further includes, in part, shifting a phase of a signal delivered for transmission by the first antenna, and shifting a phase of a signal delivered for transmission by the second antenna, In one embodiment, the method further includes, in part, shifting a phase of a signal delivered for transmission by the first antenna, shifting a phase of a signal delivered for transmission by the second antenna, and shifting a phase of a signal delivered for transmission by the third antenna.

DETAILED DESCRIPTION OF THE INVENTION

A scalable communication system, in accordance with one embodiment of the present invention, includes transmission and reception units that are isolated from one another. In one embodiment, the communication system includes N independent phased array elements and a single non-reciprocal element. Accordingly, the system enables full-duplex beam steering that is critical to many radars and next generation of cellular communication devices.

In one embodiment, the scalable system includes one non-reciprocal element that may be passive or active, such as a gyrator, a ferrite based element or a time-varying circuit, adapted to provide two isolated beams for transmitter and receiver while using the same antenna. The scalable system may be a non-reciprocal phased array system adapted to generate any receiver and/or transmitter beam pattern.

Figure 1:
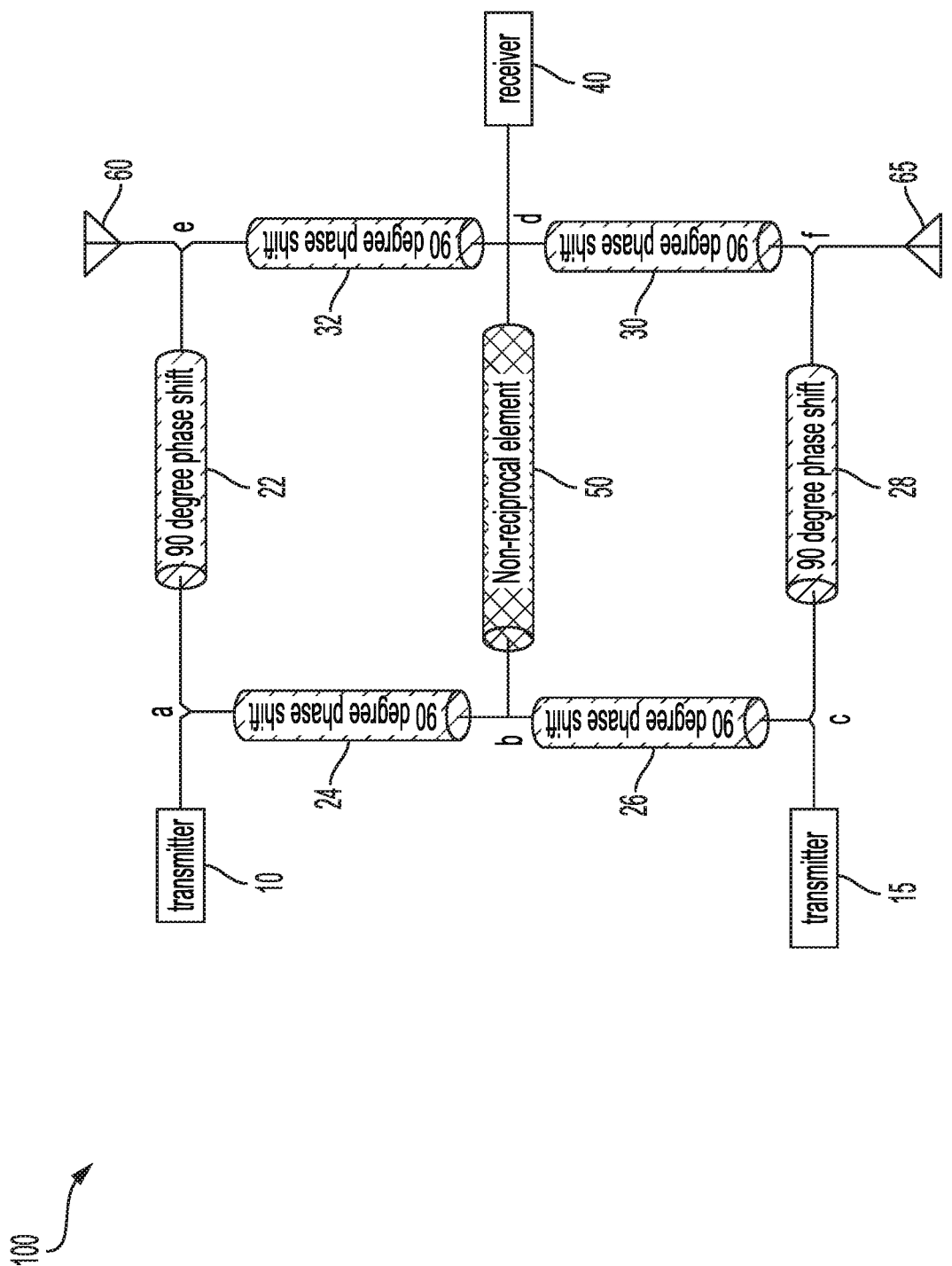
FIG. 1 is a simplified high-level block diagram of a communication transceiver, in accordance with one embodiment of the present invention.

FIG. 1 is a simplified high-level block diagram of a transceiver 100, in accordance with one embodiment of the present invention. Transceiver 100 is shown as including, in part, first and second transmitters 10, 15, receiver 40, first and second antennas 60, 65, and phase shifters 22, 24, 26, 28, 30, 32 each of which is adapted to generate a 90° phase shift. Transceiver 100 is also shown as including, in part, a non-reciprocal element 50 adapted to provide a 90° phase shift from node d to node b, and a −90° phase shift from node b to node d, as shown. Transmitters 10 and 15 have the same terminal impedance. The receiver has an impedance that is ½ of the impedance of the transmitters.

The signal generated by transmitter 10 reaches both antennas 60 and 65; however, such a signal arrives at antenna 65 through different paths, one from node d to node f, and another one from node c to node f. Due to the presence of the 90° phase shifters, and the non-reciprocal element, the signal generated by transmitter 10 and travelling from node d to node f is 90° out-of-phase with respect to the signal travelling from node c to node f; accordingly, these two signals cancel each other at node f. In other words, the signals generated by transmitted 10 and reaching antenna 65 are added together destructively and thus cancel each other. Therefore, the signal generated by transmitter 10 is not received by antenna 65 for transmission. For similar reasons, the signal generated by transmitter 15 is not received by antenna 60 for transmission. Accordingly, the signal generated by transmitter 10 is only transmitted by antenna 60, and the signal generated by transmitter 15 is only transmitted by antenna 65.

Due to the symmetry of the paths from the antennas to receiver 40, the in-phase signal received by antenna 60 and delivered to receiver 40 will remain in-phase with the signal received by antenna 65 and delivered to receiver 40 and thus is added constructively to this signal.

Furthermore, the signal received by antenna 60 and reaching transmitter 10 from node e has a phase shift of 90° relative to the signal received by antenna 60 and reaching transmitter 10 from node b. Therefore, the signal received by antenna 60 and reaching transmitter 10 from node cancels the signal received by antenna 60 and reaching transmitter 10 from node b. In other words, the signal received by antenna 60 is not received at transmitter 10. For similar reasons, the signal received by antenna 60 is not received at transmitter 15; the signal received by antenna 65 is not received at transmitter 10; and the signal received by antenna 65 is not received at transmitter 15. Accordingly, because the signals delivered by the antennas to receiver 40 is not received by the transmitters, receiver 40 is isolated from transmitters 10 and 15.

Figure 2:
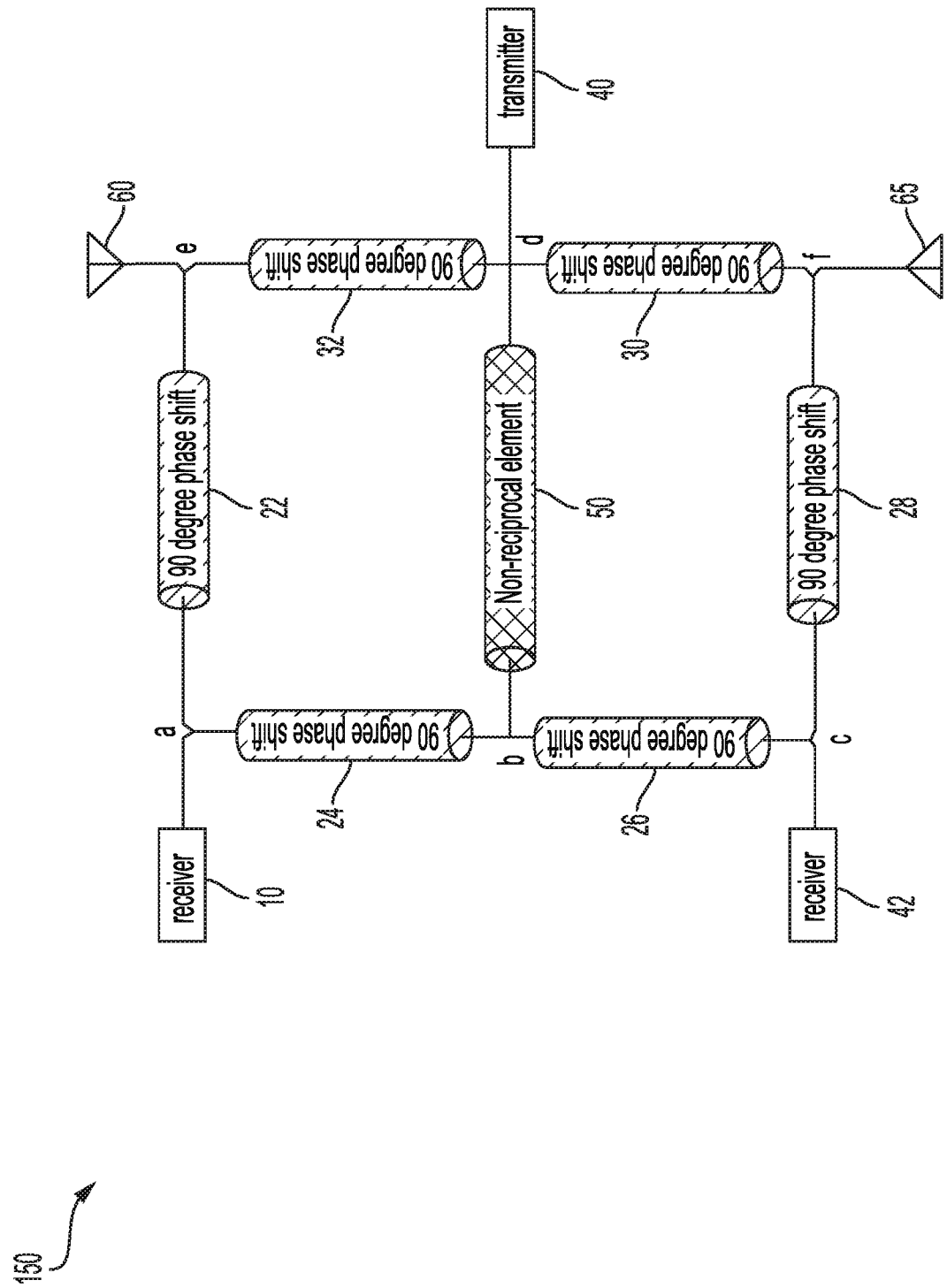
FIG. 2 is a simplified high-level block diagram of a communication transceiver, in accordance with one embodiment of the present invention.

FIG. 2 is a simplified high-level block diagram of a transceiver 150, in accordance with one embodiment of the present invention. Transceiver 150 is shown as including, in part, first and second receivers 40, 42, transmitter 10, first and second antennas 60, 65, and phase shifters 22, 24, 26, 28, 30, and 32 each adapted to generate a 90° phase shift. Transceiver 150 is also shown as including, in part, a non-reciprocal element 50 adapted to provide a 90° phase shift from node b to node d, and a −90° phase shift from node d to node b. Receivers 40 and 42 have the same terminal impedance. Transmitter 10 has an impedance that is twice the impedance of the receivers.

For the same reasons as those described above with reference to transceiver 100 of FIG. 1, the signal generated by transmitter 10 is transmitted in-phase by antennas 60 and 65; the signal generated by transmitter 10 is not received at receivers 40 and 42; the signal received by antenna 60 is only received by receiver 40; and the signal received by antenna 65 is only received by receiver 42.

Figure 3:
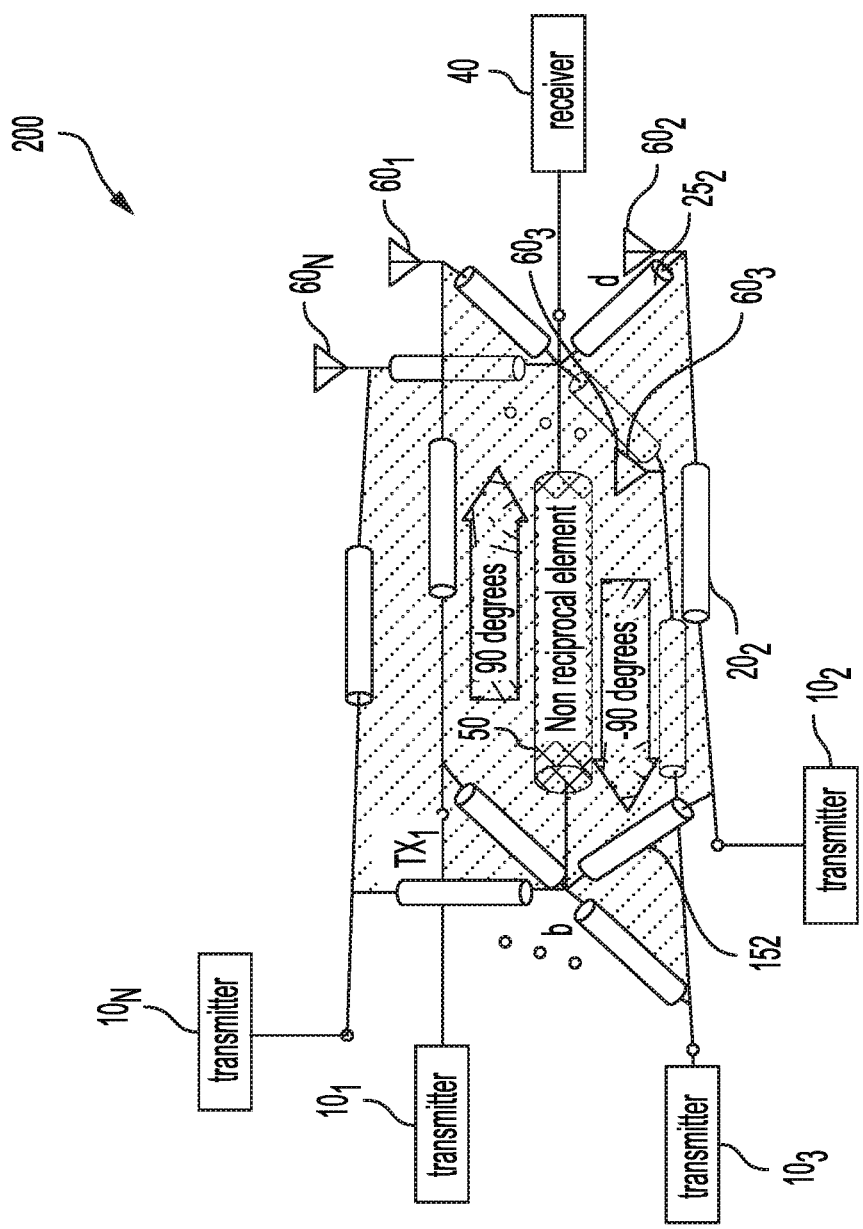
FIG. 3 is a simplified high-level block diagram of a communication transceiver, in accordance with one embodiment of the present invention.

FIG. 3 is a simplified high-level block diagram of a transceiver 200, in accordance with one embodiment of the present invention. Transceiver 200 includes N transmitters $10_1$, $10_2$ $10_N$, N antennas $60_1$, $60_2$ $60_N$ and a receiver 40, where N is an integer greater 2. Each transmitter $10_i$ is associated with one antenna $60_i$, where i is an integer ranging from 1 to N. Therefore, for the reasons described above with reference to FIG. 1, the signal generated by transmitter $10_i$ is only transmitted by its associated antenna $60_i$. For example, the signal generated by transmitter $10_1$ is only transmitted by its associated antenna $60_1$, and the signal generated by transmitter $10_3$ is only transmitted by its associated antenna $60_3$. Each transmitter $10_i$ is controlled independently. The transmitter ports are mutually isolated. The transmitter pots are also isolated from the antennas and the receiver.

Transceiver 200 is also shown as including, in part, a non-reciprocal element 50 adapted to provide a 90° phase shift from node d to node b, and a −90° phase shift from node b to node d. All transmitters $10_i$ have the same terminal impedance. Each transmitter has an impedance that is N time the impedance of the receiver.

Transceiver 200 is also shown as including, in part, a 90° phase shifter $15_i$ disposed between transmitter $10_i$ and node b. For example, 90° phase shifter $15_2$ is disposed between transmitter $10_2$ and node b. Transceiver 200 is also shown as including, in part, a 90° phase shifter $20_i$ disposed between transmitter $40_i$ and its associated antenna $60_i$. For example, 90° phase shifter $20_2$ is disposed between transmitter $10_2$ and antenna $60_2$. Transceiver 200 is also shown as including, in part, a 90° phase shifter $25_i$ disposed between each antenna and node d. For example, 90° phase shifter $25_2$ is disposed between antenna $60_2$ and node d. For the same reasons as described above with respect to FIG. 1, the signal received by the receiver is not received at the transmitters. Therefore, the receivers and the transmitter of transceiver 200 are isolated form one another. The signals received by the antennas adds constructively at the receiver.

Figure 4:
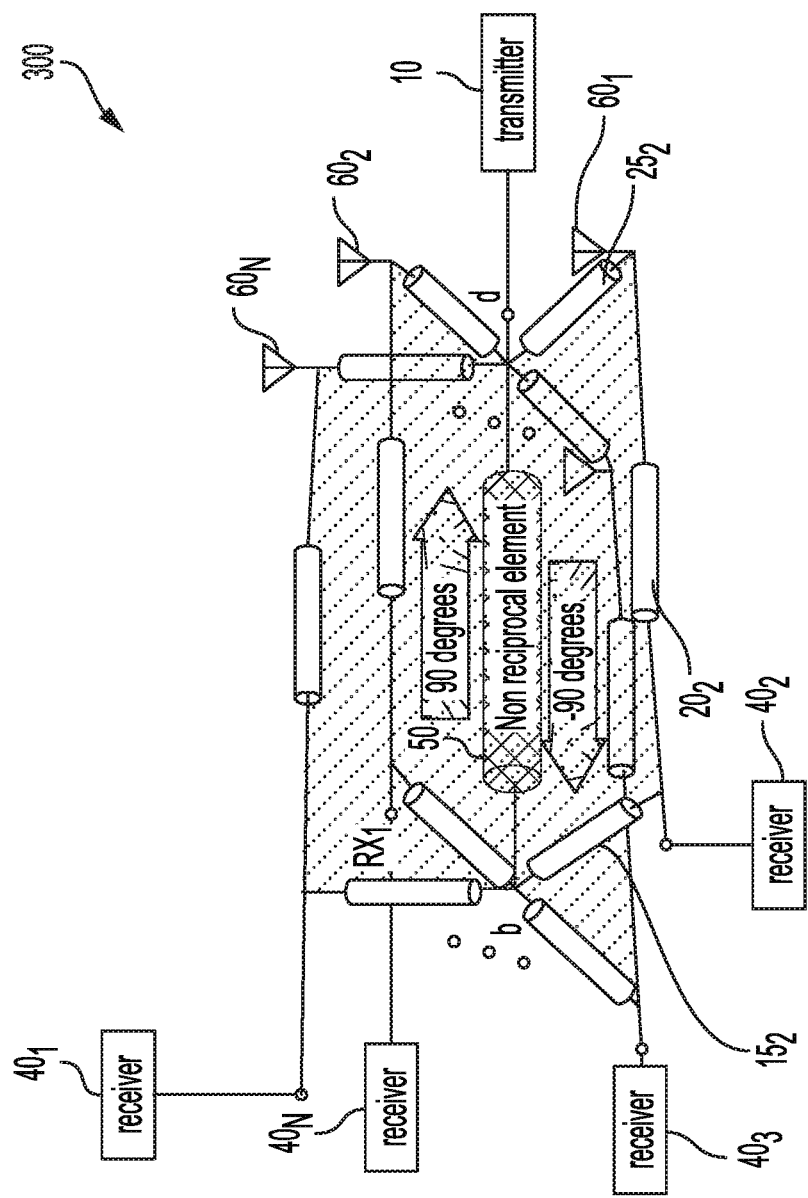
FIG. 4 is a simplified high-level block diagram of a communication transceiver, in accordance with one embodiment of the present invention.

FIG. 4 is a simplified high-level block diagram of a transceiver 300, in accordance with one embodiment of the present invention. Transceiver 300 includes N receivers $40_1$, $40_2$ $40_N$, N antennas $60_1$, $60_2$ $60_N$ and a transmitter 40, where N is an integer greater 2. Each receiver $40_i$ is associated with one antenna $60_i$, where i is an integer ranging from 1 to N. Therefore, for the reasons described above with reference to the transceivers shown in FIGS. 1 and 2, the signal generated by transmitter 10 is transmitted in-phase by all antennas $60_i$; the signal generated by transmitter 10 is not received at receivers $40_i$; and the signal received by antenna $60_i$ is only received by receiver $40_i$. Each receiver $40_i$ is controlled independently. The receiver ports are mutually isolated. The receiver ports are also isolated from the antennas and the transmitter port.

Transceiver 300 is also shown as including, in part, a non-reciprocal element 50 adapted to provide a 90° phase shift from node b to node d, and a −90° phase shift from node d to node b, as shown. All receivers $40_i$ have the same terminal impedance which is 1/N the impedance of transmitter 10.

Transceiver 300 is also shown as including, in part, a 90° phase shifter $15_i$ disposed between receiver $40_i$ and node b. For example, 90° phase shifter $15_2$ is disposed between receiver $40_2$ and node b. Transceiver 300 is also shown as including, in part, a 90° phase shifter $20_i$ disposed between receiver $40_i$ and its associated antenna $60_i$. For example, 90° phase shifter $20_2$ is disposed between receiver $40_2$ and antenna $60_2$. Transceiver 300 is also shown as including, in part, a 90° phase shifter $25_i$ disposed between each antenna and node d. For example, 90° phase shifter $25_2$ is disposed between antenna $60_2$ and node d. For the same reasons as described above with respect to FIG. 1, the signal received by the receivers is not received at the transmitter. Therefore, the receivers and the transmitter of transceiver 300 are isolated form one another. The signals received by the antennas adds constructively at the receivers.

Figure 5:
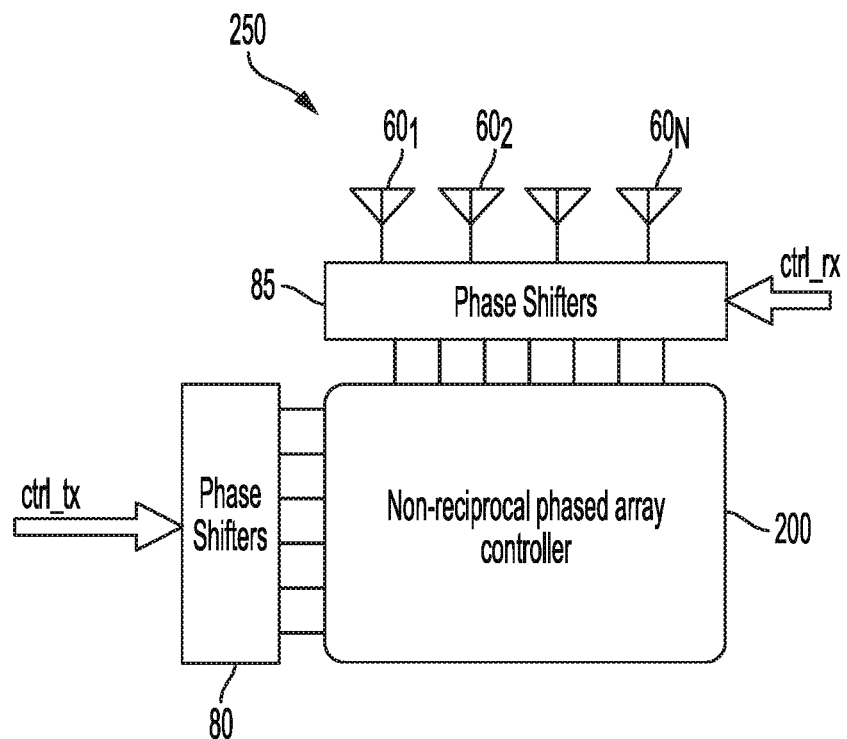
FIG. 5 is a simplified high-level block diagram of a phased array transmitter/receiver in accordance with one embodiment of the present invention.

FIG. 5 is a simplified high-level block diagram of a phased array transmitter/receiver 250 in accordance with one embodiment of the present invention. Phased array 250 includes, in part, a transceiver 200 the details of which are shown in FIG. 3 and described above. Phased array 250 is also shown as including, in part, a phase shifter block 80 having N phase shifters each adapted to shift a phase of the signal generated by a different one of the N transmitters $10_i$ (see FIG. 3) in response to signal Ctrl_tx. Phased array 250 is also shown as including, in part, a second phase shifter block 85 having N phase shifters each adapted to shift the phase of the signal received by a different one of the N antennas in response to signal Ctrl_rx. It is understood that antennas $60_1$ $60_N$ are the same antennas as shown in FIG. 3 and are used to transmit a field pattern generated by the transmitters and phase shifter block 80. The signal received by antennas $60_1$ $60_N$ is phase shifted by phase shifter block 85 to generate a desired received field pattern. It is also understood that the phase shifters in each of phase shifter blocks 80 and 85 are independently controlled.

Figure 6:
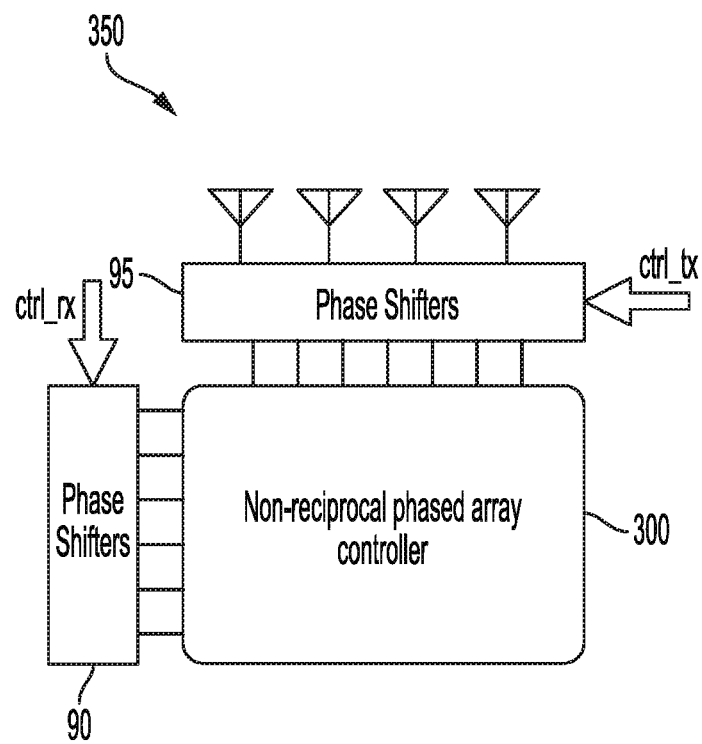
FIG. 6 is a simplified high-level block diagram of a phased array transmitter/receiver in accordance with one embodiment of the present invention.
Figure 7A:
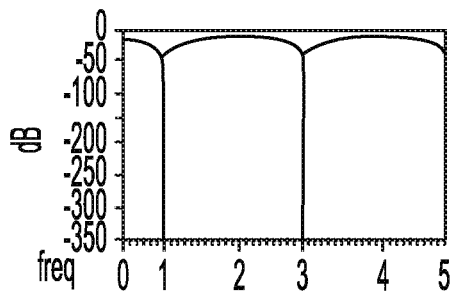
FIGS. 7A, 7B, 7C, 7D and 7E are computer simulations showing the impedances at various ports of the transceiver of FIG. 1, in accordance with one embodiment of the present invention.
Figure 7B:
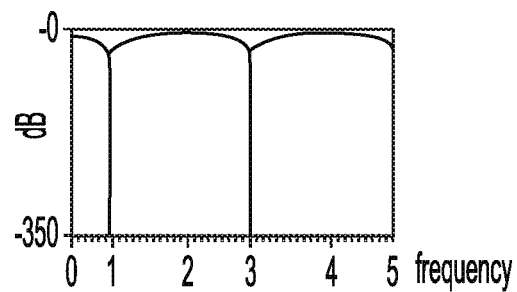
Figure 7C:
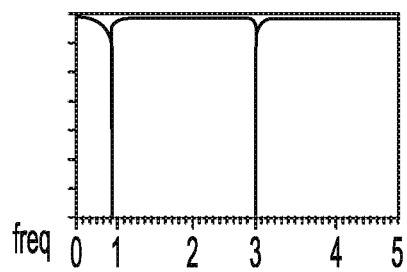
Figure 7D:
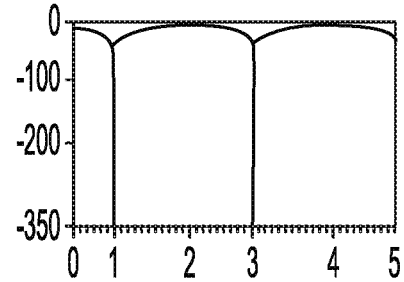
Figure 7E:
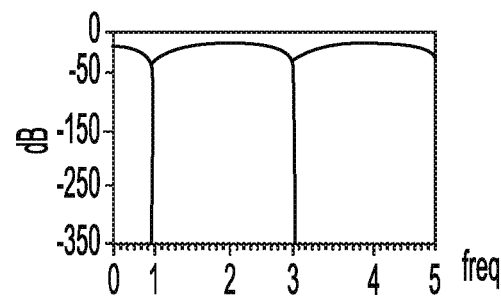

FIG. 6 is a simplified high-level block diagram of a phased array transmitter/receiver 350 in accordance with one embodiment of the present invention. Phased array 350 includes, in part, a transceiver 300 the details of which as shown in FIG. 4 and described above. Phased array 350 is also shown as including, in part, a phase shifter block 90 having N phase shifters each adapted to shift a phase of the signals received by a different one of the N receivers $40_i$ (see FIG. 3) in response to signal Ctrl_rx. Phased array 250 is also shown as including, in part, a second phase shifter block 95 having N phase shifters each adapted to shift the phase of the signal generated by the transmitter 10 by a different amount in response to signal Ctrl_tx. It is understood that antennas $60_1$ $60_N$ are the same antennas as shown in FIG. 3 and are used to transmit a field pattern generated by the transmitter in response to phase shifter block 95. The signals received by antennas $60_1$ $60_N$ are phase shifted by phase shifter block 90 to generate a desired received field pattern. It is also understood that the phase shifters in each of phase shifter blocks 90 and 95 are independently controlled.

FIGS. 7A, 7B, 7C, 7D and 7E are computer simulations showing the impedances at ports of transmitter 10, antenna 60, transmitter 15, antenna 65 and receiver 40, respectively of transceiver 100 of FIG. 1. The x-axis show the frequency in GHZ and the y-axis show the power in dB. As is seen from these Figures, the impedances are matched at 1 GHz, which is the frequency selected for the simulation. The impedances are also matched at 3 GHz and 5 GHz.

Figure 8A:
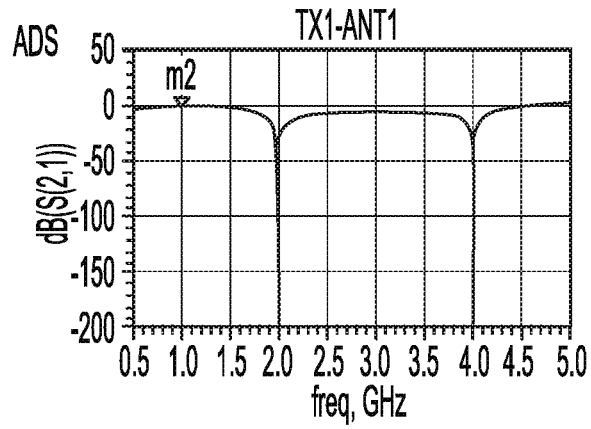
FIGS. 8A, 8B, 8C, and 8D are computer simulations showing the isolations between the transmitters, antennas and receiver of the transceiver of FIG. 1, in accordance with one embodiment of the present invention.
Figure 8B:
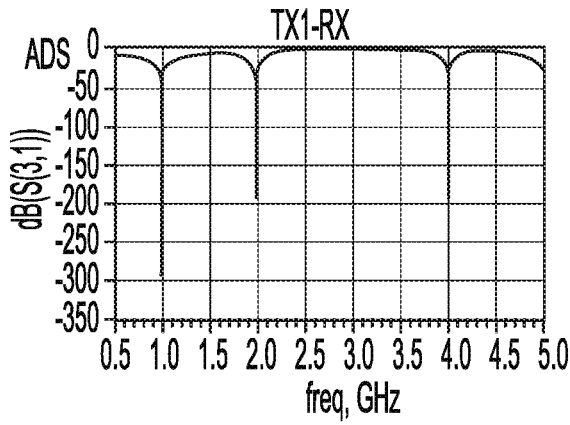
Figure 8C:
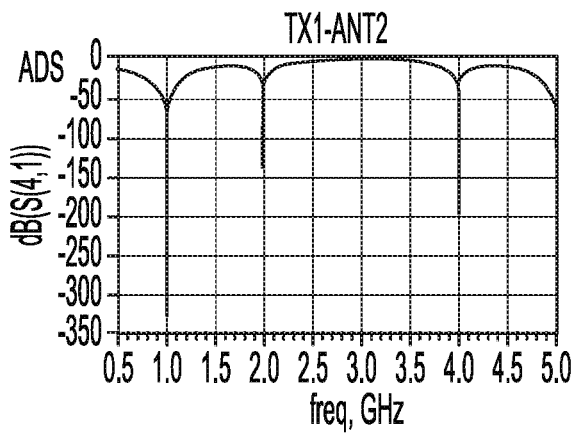
Figure 8D:
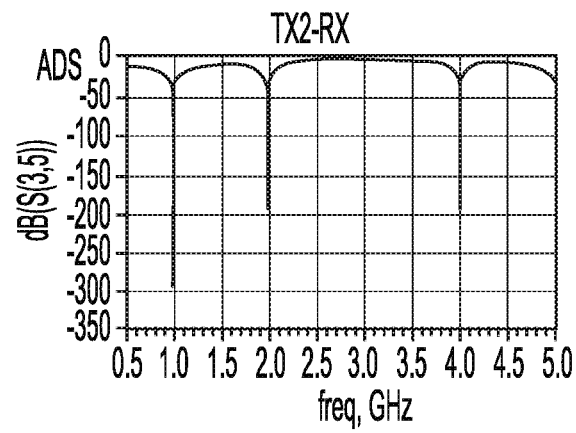
Figure 9:
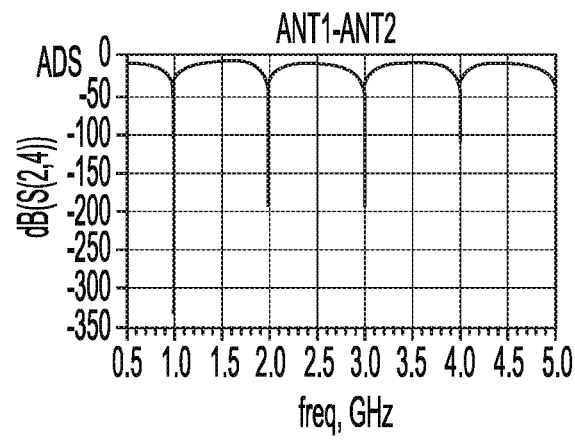
FIG. 9 is a computer simulation showing the isolation between the two antennas of the transceiver of FIG. 1, in accordance with one embodiment of the present invention.

FIGS. 8A, 8B, 8C, and 8D are computer simulations showing respectively the isolation between transmitter 10 and antenna 60, transmitter 10 and receiver 40, transmitter 10 and antenna 65, and transmitter 15 and receiver 40 of transceiver 100 of FIG. 1. As is seen from FIG. 8A, at the simulation frequency of 1 GHz, the path from transmitter 10 to antenna 60 has the least amount of power loss. FIGS. 8B, 8C and 8D respectively show that the path between transmitter 10 and receiver 40, the path between transmitter 10 and antenna 65, and the path between transmitter 15 and receiver 40 are fully isolated at the simulation frequency of 1 GHz. FIG. 9 is a computer simulation showing the isolation between the first and second antennas 60 and 65 of transceiver 100 of FIG. 1.

Figure 10A:
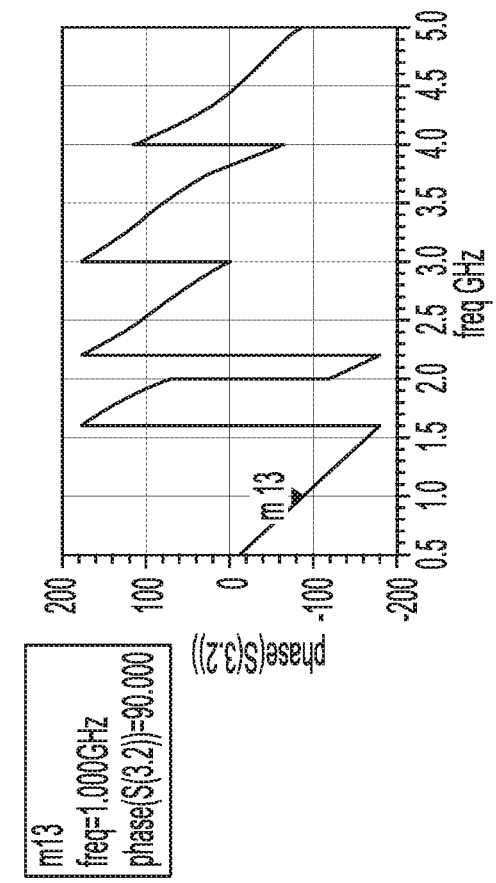
FIGS. 10A and 10C are computer simulation respectively showing the amount of power delivered to the receiver by antenna 1 and antenna 2 of the transceiver FIG. 1.
Figure 10B:
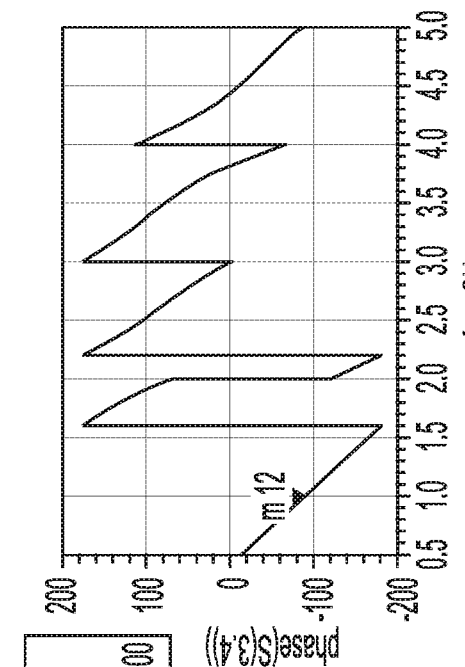
FIGS. 10B and 10D are computer simulation respectively showing the phases of the signal delivered from antennas 1 and 2 to the receiver disposed in the transceiver of FIG. 1.
Figure 10C:
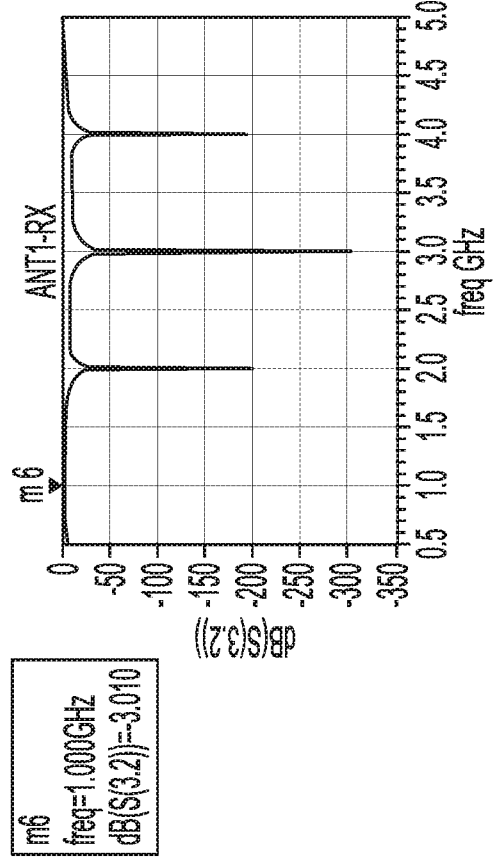
Figure 10D:
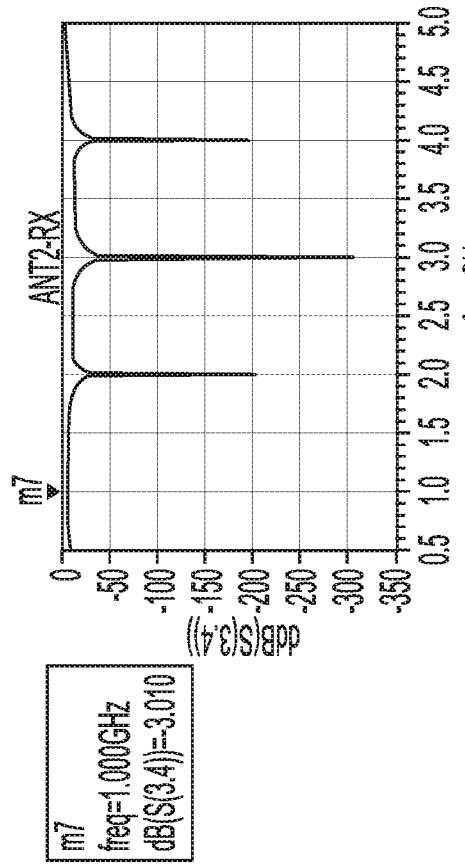

FIGS. 10A and 10C respectively show power loss in the path between antenna 60 and receiver 40, and in the path between antenna 65 and receiver 40 of transceiver 100 of FIG. 1. As is seen from these two figures, the signals from the antennas to the receiver are in phase. FIG. 10A shows that half of the power delivered to the receiver is supplied by antenna 1 and FIG. 10C shows that half of the power delivered to the receiver is supplied by antenna 2. FIG. 10B shows the phase of the signal travelling from antenna 1 to the receiver and FIG. 10D shows the phase of the signal travelling from antenna 2 to receiver.

Figure 11A:
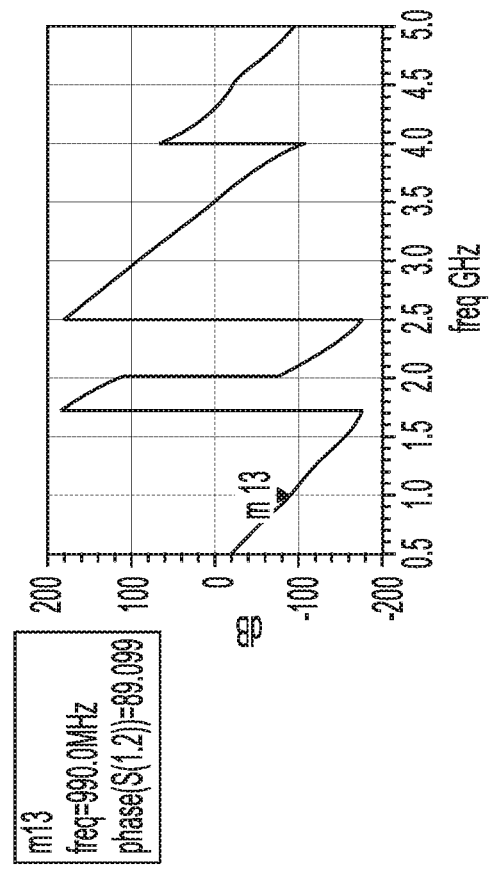
FIGS. 11A and 11C are computer simulation showing that a quarter of the powers received by antenna 1 and antenna 2 cancel each other at transmitter 1.
Figure 11B:
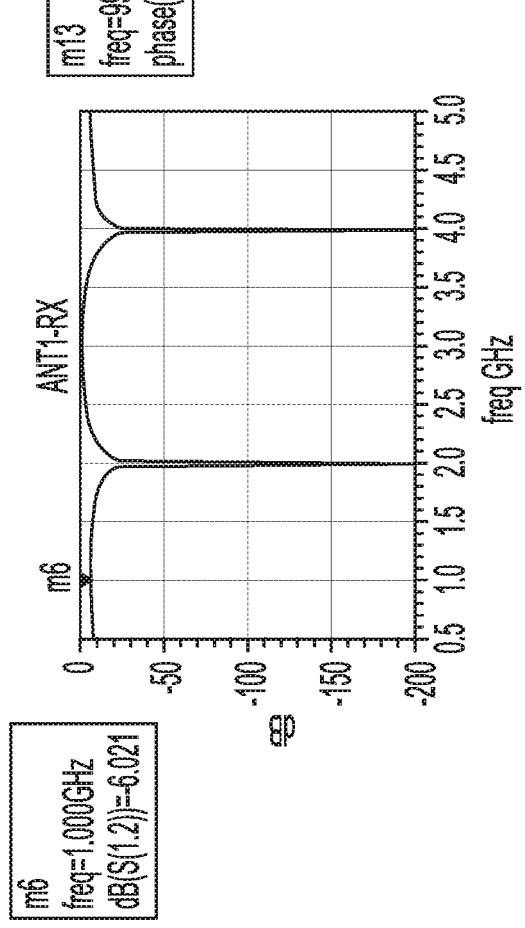
FIGS. 11B and 11D are computer simulation showing respectively the phase of the signal travelling from antennas 1 and 2 to the transmitter 1 disposed in the transceiver of FIG. 1.
Figure 11C:
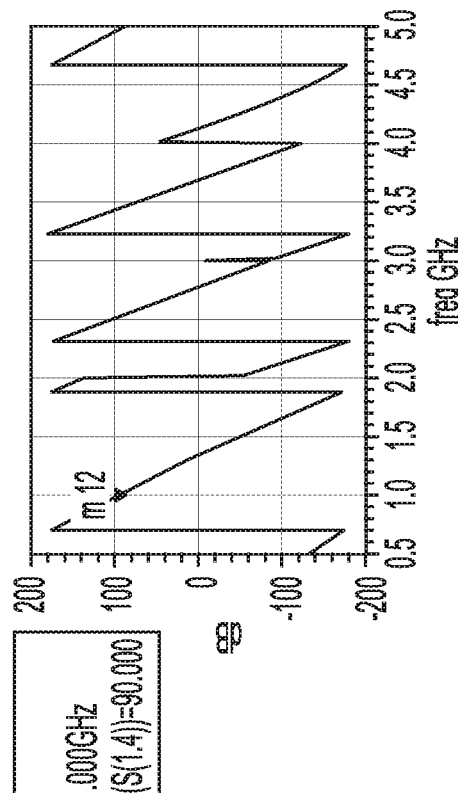
Figure 11D:
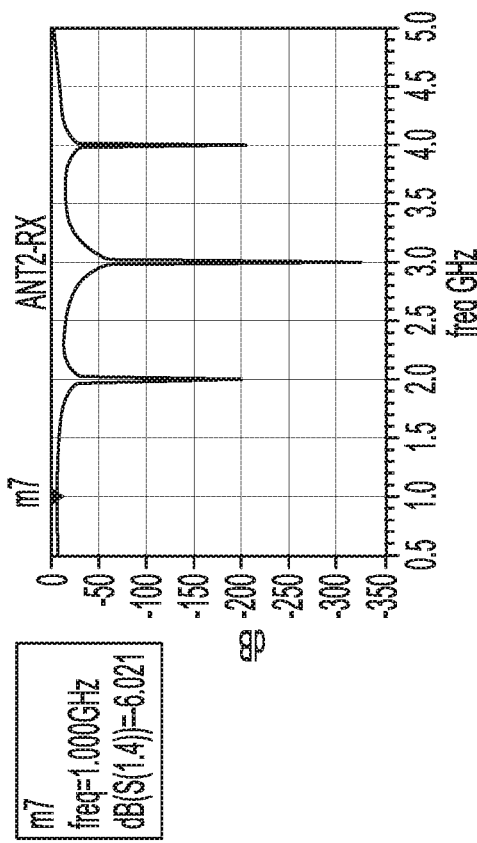

FIG. 11A shows that a quarter of the power received by antenna 1 is present at transmitter 1, and FIG. 11C shows that quarter of the power received by antenna 2 is present at transmitter 1 but because these two power signal are out of phase at the transmitter, they cancel each other out. Therefore, no power is delivered by the antenna to the transmitters. FIG. 11B shows the phase of the signal travelling from antenna 1 to transmitter 1, and FIG. 11D shows the phase of the signal travelling from antenna 1 to transmitter 1.

The above embodiments of the present invention are illustrative and not limitative. Other additions, subtractions or modifications are obvious in view of the present disclosure and are intended to fall within the scope of the appended claims.

What is claimed is:

1. A communicate device comprising:
a first transmitter coupled to a first terminal of a first 90° phase shifter having a second terminal coupled to a first antenna, and to a first terminal of a second 90° phase shifter having a second terminal coupled to a first node;
a second transmitter coupled to a first terminal of a third 90° phase shifter having a second terminal coupled to a second antenna, and to a first terminal of a fourth 90° phase shifter having a second terminal coupled to the first node;
a receiver coupled to a first terminal of a fifth 90° phase shifter having a second terminal coupled to the first antenna, and to a first terminal of a sixth 90° phase shifter having a second terminal coupled to the second antenna; and
a non-reciprocal element coupled between the receiver and the first node, wherein the non-reciprocal element provides a 90° phase shift from the receiver to the first node and a −90° phase shift from the first node to the receiver.

2. The communicate device of claim 1 further comprising:
a third transmitter coupled to a first terminal of a seventh 90° phase shifter having a second terminal coupled to a third antenna, and to a first terminal of an eighth 90° phase shifter having a second terminal coupled to the first node, said third antenna being coupled to the receiver via a ninth 90° phase shifter.

3. The communication device of claim 2 further comprising:
a first phase shifter adapted to shift a phase of a signal generated by the first transmitter;
a second phase shifter adapted to shift a phase of a signal generated by the second transmitter; and
a third phase shifter adapted to shift a phase of a signal generated by the third transmitter.

4. The communication device of claim 3 further comprising:
a fourth phase shifter adapted to shift a phase of a signal received by the first antenna;
a fifth phase shifter adapted to shift a phase of a signal received by the second antenna; and
a sixth phase shifter adapted to shift a phase of a signal received by the third antenna.

5. The communicate device of claim 2 further comprising:
a fourth transmitter coupled to a first terminal of a tenth 90° phase shifter having a second terminal coupled to a fourth antenna, and to a first terminal of an eleventh 90° phase shifter having a second terminal coupled to the first node, said fourth antenna being coupled to the receiver via a twelfth 90° phase shifter.

6. The communication device of claim 1 further comprising:
a first phase shifter adapted to shift a phase of a signal generated by the first transmitter; and
a second phase shifter adapted to shift a phase of a signal generated by the second transmitter.

7. The communication device of claim 6 further comprising:
a third phase shifter adapted to shift a phase of a signal received by the first antenna; and
a fourth phase shifter adapted to shift a phase of a signal received by the second antenna.

8. A communicate device comprising:
a first receiver coupled to a first terminal of a first 90° phase shifter having a second terminal coupled to a first antenna, and to a first terminal of a second 90° phase shifter having a second terminal coupled to a first node;
a second receiver coupled to a first terminal of a third 90° phase shifter having a second terminal coupled to a second antenna, and to a first terminal of a fourth 90° phase shifter having a second terminal coupled to the first node;
a transmitter coupled to a first terminal of a fifth 90° phase shifter having a second terminal coupled to the first antenna, and to a first terminal of a sixth 90° phase shifter having a second terminal coupled to the second antenna; and
a non-reciprocal element coupled between the transmitter and the first node, wherein the non-reciprocal element provides a −90° phase shift from the transmitter to the first node and a 90° phase shift from the first node to the transmitter.

9. The communicate device of claim 8 further comprising:
a third receiver coupled to a first terminal of a seventh 90° phase shifter having a second terminal coupled to a third antenna, and to a first terminal of an eighth 90° phase shifter having a second terminal coupled to the first node, said third antenna being coupled to the third receiver via a ninth 90° phase shifter.

10. The communication device of claim 9 further comprising:
a first phase shifter adapted to shift a phase of a signal received by the first receiver;
a second phase shifter adapted to shift a phase of a signal received by the second receiver; and
a third phase shifter adapted to shift a phase of a signal received by the third receiver.

11. The communication device of claim 10 further comprising:
a fourth phase shifter adapted to shift a phase of a signal delivered for transmission by the first antenna;

a fifth phase shifter adapted to shift a phase of a signal delivered for transmission by the second antenna; and
a sixth phase shifter adapted to shift a phase of a signal delivered for transmission by the third antenna.

12. The communication device of claim 9 further comprising:
a fourth receiver coupled to a first terminal of a tenth 90° phase shifter having a second terminal coupled to a fourth antenna, and to a first terminal of an eleventh 90° phase shifter having a second terminal coupled to the first node, said fourth antenna being coupled to the fourth receiver via a twelfth 90° phase shifter.

13. The communication device of claim 8 further comprising:
a first phase shifter adapted to shift a phase of a signal received by the first receiver; and
a second phase shifter adapted to shift a phase of a signal received by the second receiver.

14. The communication device of claim 13 further comprising:
a third phase shifter adapted to shift a phase of a signal delivered for transmission by the first antenna; and
a fourth phase shifter adapted to shift a phase of a signal delivered for transmission by the second antenna.

15. A method of communication, the method comprising:
coupling a first transmitter to a first terminal of a first 90° phase shifter having a second terminal coupled to a first antenna, and to a first terminal of a second 90° phase shifter having a second terminal coupled to a first node;
coupling a second transmitter to a first terminal of a third 90° phase shifter having a second terminal coupled to a second antenna, and to a first terminal of a fourth 90° phase shifter having a second terminal coupled to the first node;
coupling a receiver to a first terminal of a fifth 90° phase shifter having a second terminal coupled to the first antenna, and to a first terminal of a sixth 90° phase shifter having a second terminal coupled to the second antenna; and
coupling a non-reciprocal element between the receiver and the first node, wherein the non-reciprocal element provides a 90° phase shift from the receiver to the first node and a −90° phase shift from the first node to the receiver.

16. The method if claim 15 further comprising:
coupling a third transmitter to a first terminal of a seventh 90° phase shifter having a second terminal coupled to a third antenna, and to a first terminal of an eighth 90° phase shifter having a second terminal coupled to the first node, said third antenna being coupled to the receiver via a ninth 90° phase shifter.

17. The method of claim of 16 further comprising:
shifting a phase of a signal generated by the first transmitter;
shifting a phase of a signal generated by the second transmitter; and
shifting a phase of a signal generated by the third transmitter.

18. The method of claim 17 further comprising:
shifting a phase of a signal received by the first antenna;
shifting a phase of a signal received by the second antenna; and
shifting a phase of a signal received by the third antenna.

19. The method of claim 16 further comprising:
coupling a fourth transmitter to a first terminal of a tenth 90° phase shifter having a second terminal coupled to a fourth antenna, and to a first terminal of an eleventh 90° phase shifter having a second terminal coupled to the first node, said fourth antenna being coupled to the receiver via a twelfth 90° phase shifter.

20. The method of claim of claim 15 further comprising:
shifting a phase of a signal generated by the first transmitter; and
shifting a phase of a signal generated by the second transmitter.

21. The method of claim 20 further comprising:
shifting a phase of a signal received by the first antenna; and
shifting a phase of a signal received by the second antenna.

22. A method of communication, the method comprising:
coupling a first receiver to a first terminal of a first 90° phase shifter having a second terminal coupled to a first antenna, and to a first terminal of a second 90° phase shifter having a second terminal coupled to a first node;
coupling a second receiver to a first terminal of a third 90° phase shifter having a second terminal coupled to a second antenna, and to a first terminal of a fourth 90° phase shifter having a second terminal coupled to the first node;
coupling a transmitter to a first terminal of a fifth 90° phase shifter having a second terminal coupled to the first antenna, and to a first terminal of a sixth 90° phase shifter having a second terminal coupled to the second antenna; and
coupling a non-reciprocal element between the transmitter and the first node, wherein the non-reciprocal element provides a −90° phase shift from the transmitter to the first node and a 90° phase shift from the first node to the transmitter.

23. The method of claim 22 further comprising:
coupling a third receiver to a first terminal of a seventh 90° phase shifter having a second terminal coupled to a third antenna, and to a first terminal of an eighth 90° phase shifter having a second terminal coupled to the first node, said third antenna being coupled to the third receiver via a ninth 90° phase shifter.

24. The method of claim 23 further comprising:
shifting a phase of a signal received by the first receiver;
shifting a phase of a signal received by the second receiver; and
shifting a phase of a signal received by the third receiver.

25. The method of claim 24 further comprising:
shifting a phase of a signal delivered for transmission by the first antenna;
shifting a phase of a signal delivered for transmission by the second antenna; and
shifting a phase of a signal delivered for transmission by the third antenna.

26. The method of claim 23 further comprising:
coupling a fourth receiver to a first terminal of a tenth 90° phase shifter having a second terminal coupled to a fourth antenna, and to a first terminal of an eleventh 90° phase shifter having a second terminal coupled to the first node, said fourth antenna being coupled to the fourth receiver via a twelfth 90° phase shifter.

27. The method of claim 22 further comprising:
shifting a phase of a signal received by the first receiver; and
shifting a phase of a signal received by the second receiver.

28. The method of claim 27 further comprising:
shifting a phase of a signal delivered for transmission by the first antenna; and shifting a phase of a signal delivered for transmission by the second antenna.

* * * * *